(12) United States Patent
Chen et al.

(10) Patent No.: US 11,547,027 B2
(45) Date of Patent: Jan. 3, 2023

(54) SWITCH-MODE POWER SUPPLY WASTE HEAT RECOVERY AND UTILIZATION SYSTEM

(71) Applicant: Jiangxi Xinborui Technology Co., Ltd., Yingtan (CN)

(72) Inventors: Xiaodong Chen, Yingtan (CN); Zeren Chen, Yingtan (CN); Guohe Huang, Yingtan (CN)

(73) Assignee: JIANGXI XINBORUI TECHNOLOGY CO., LTD., Yingtan (CN)

( * ) Notice: Subject to any disclaimer, the term of this patent is extended or adjusted under 35 U.S.C. 154(b) by 35 days.

(21) Appl. No.: 17/344,976

(22) Filed: Jun. 11, 2021

(65) Prior Publication Data
US 2021/0392793 A1   Dec. 16, 2021

(30) Foreign Application Priority Data

Jun. 15, 2020 (CN) .......................... 202010543178.6

(51) Int. Cl.
| | | |
|---|---|---|
| H05K 7/20 | (2006.01) | |
| H02M 1/32 | (2007.01) | |
| H02M 3/158 | (2006.01) | |

(52) U.S. Cl.
CPC ........ H05K 7/20927 (2013.01); H02M 1/327 (2021.05); H02M 3/158 (2013.01); H05K 7/20663 (2013.01)

(58) Field of Classification Search
CPC ........... H05K 7/20927; H05K 7/20663; H05K 7/20645; H05K 7/20263; H05K 7/20272; H05K 7/20281; H02M 1/327; H02M 3/158; H02M 1/00; F24D 2200/29;
(Continued)

(56) References Cited

U.S. PATENT DOCUMENTS

2001/0039944 A1* 11/2001 Braun ................ F02M 37/0047
123/510
2009/0126910 A1*  5/2009 Campbell .......... H05K 7/20781
165/104.33
(Continued)

FOREIGN PATENT DOCUMENTS

CN         104359151 A   *  2/2015
JP         2019195042 A  * 11/2019

*Primary Examiner* — Abhishek M Rathod
(74) *Attorney, Agent, or Firm* — Leong C. Lei

(57) ABSTRACT

A switch-mode power supply waste heat recovery and utilization system includes a switch-mode power supply unit, an air conditioner and a water storage tank that are all connected with pipes. The switch-mode power supply unit, the air conditioner and the water storage tank are in communication with each other through the pipes. The switch-mode power supply unit includes a cabinet. Fixed plates are fixedly connected to an inner side wall of the cabinet and arranged at equal intervals. A top and a bottom of the cabinet and respective interiors of the fixed plates are formed with cavities. The pipes are in communication with the cavities. A fan is fixedly connected to a side wall of the water storage tank, and is matched with the water storage tank. A filter screen is insertedly connected to an inner side wall of the water storage tank. A filter cotton is horizontally provided under the filter screen.

10 Claims, 6 Drawing Sheets

(58) Field of Classification Search
CPC ........ F24D 11/005; Y02E 60/14; Y02P 80/15; F24F 5/0017; F24F 5/0003; F24F 13/28
See application file for complete search history.

(56) References Cited

U.S. PATENT DOCUMENTS

| | | | | |
|---|---|---|---|---|
| 2010/0290190 | A1* | 11/2010 | Chester | B65B 63/08 174/547 |
| 2010/0314070 | A1* | 12/2010 | Yang | F24T 10/15 165/45 |
| 2017/0303440 | A1* | 10/2017 | Shimasaki | H05K 7/20254 |

* cited by examiner

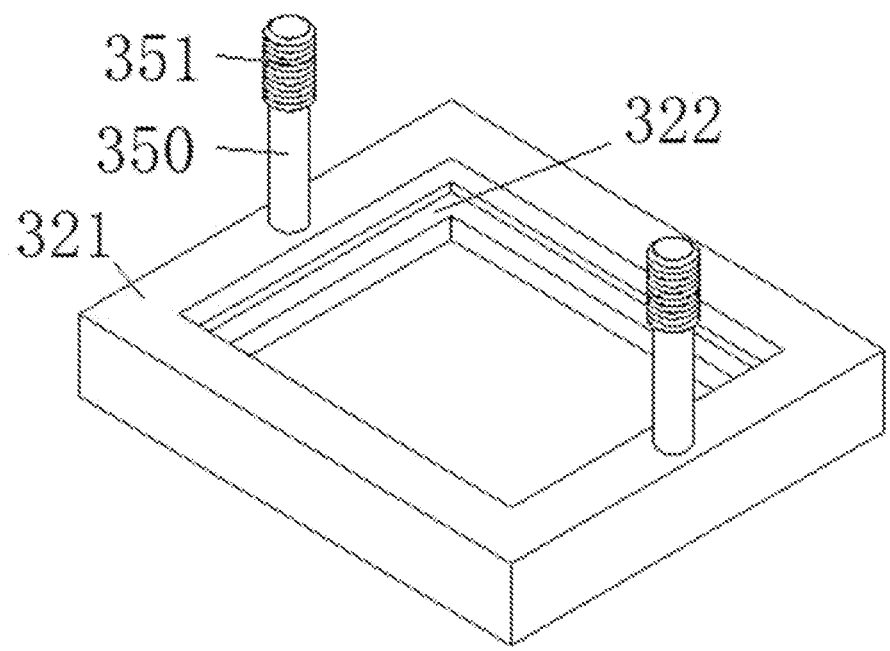
F I G. 7
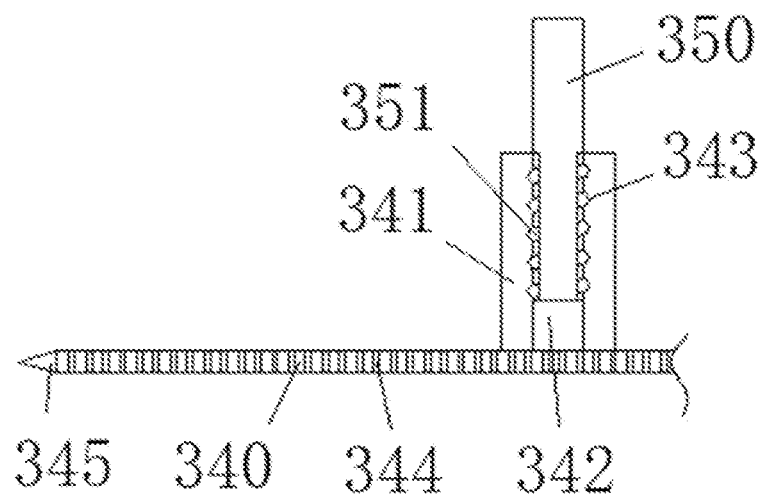
F I G. 8

SWITCH-MODE POWER SUPPLY WASTE HEAT RECOVERY AND UTILIZATION SYSTEM

BACKGROUND OF THE INVENTION

1. Field of the Invention

The present invention relates to a waste heat recovery, and more particularly to a switch-mode power supply waste heat recovery and utilization system.

2. Description of the Prior Art

A switch-mode power supply, also known as switching power supply or switching converter, is a high-frequency electric energy conversion device. Its function is to convert a level of voltage into the voltage or current required by the user through different forms of architecture. A conventional switch-mode power supply (rectifier cabinet) will generate a lot of heat energy when in use, so it needs to be cooled with cold water. The temperature of cold water needs to be kept at about 26-30° C., and the temperature of the output water of the switch-mode power supply is around 35-40° C., so it is required to add a cooling tower for lowering the temperature. The cooling tower needs a motor of about 30 KW and the energy consumption of the pump is 720 kWh a day. The heat in the water is dissipated slowly, and heat energy is generated. It will also cause a waste of water resources.

SUMMARY OF THE INVENTION

In order to solve the problems of the prior art, the primary object of the present invention is to provide a switch-mode power supply waste heat recovery and utilization system.

In order to achieve the above objects, the present invention adopts the following technical solutions:

A switch-mode power supply waste heat recovery and utilization system comprises a switch-mode power supply unit, an air conditioner, and a water storage tank. The switch-mode power supply unit, the air conditioner and the water storage tank are connected with pipes. The switch-mode power supply unit, the air conditioner and the water storage tank are in communication with each other through the pipes.

The switch-mode power supply unit includes a cabinet. Fixed plates are fixedly connected to an inner side wall of the cabinet and are arranged at equal intervals. A top and a bottom of the cabinet and respective interiors of the fixed plates are formed with cavities. The pipes are in communication with the cavities.

A fan is fixedly connected to a side wall of the water storage tank. The fan is matched with the water storage tank. A filter screen is insertedly connected to an inner side wall of the water storage tank. A filter cotton is horizontally provided under the filter screen. A lower surface of the filter cotton is in contact with a load plate. The load plate is connected to the filter screen through connecting rods.

Preferably, staggered through holes are formed in opposing side walls of the cabinet. Every adjacent two of the cavities are in communication with each other through a corresponding one of the through holes. The pipe on the water storage tank is fixedly connected to the corresponding side wall of the cabinet and is in communication with the cavity of the top of the cabinet.

Preferably, the pipe on the switch-mode power supply unit is fixedly connected to the corresponding side wall of the cabinet and is in communication with the cavity of the bottom of the cabinet. The pipe on the cabinet is in communication with a heating pipe on the air conditioner.

Preferably, a retaining cylinder is obliquely, fixedly connected to the side wall of the water storage tank. The fan is fixedly connected to an inner side wall of the retaining cylinder. The pipe on the air conditioner is fixedly connected to the side wall of the water storage tank and is located above the retaining cylinder.

Preferably, a rectangular frame is provided on an outside of the filter screen. Grooves communicating with each other are formed in inner side walls of the rectangular frame. Four circumferential walls of the filter screen are located in the grooves, respectively.

Rectangular grooves are formed in opposing inner side walls of the water storage tank. Ends of the rectangular frame are located in the rectangular grooves. The rectangular grooves each have an open top.

Preferably, the connecting rods are symmetrically arranged below the rectangular frame. Upper ends of the connecting rods are rotatably connected to a lower surface of the rectangular frame. Connecting cylinders symmetrically arranged are fixedly connected to an upper surface of the load plate. Upper ends of the connecting cylinders penetrate the filter cotton and are threadedly connected to the respective connecting rods.

Preferably, a sealing gasket is fixedly connected to a bottom of each connecting cylinder. The upper end of each connecting cylinder is provided with an internal thread. A lower end of each connecting rod is provided with an external thread. The external thread is mated with the internal thread. A lower end face of each connecting rod is in contact with an upper surface of the sealing gasket.

Preferably, the load plate is formed with a plurality of perforations that are equally spaced. A scraper is fixedly connected to a circumferential wall of the load plate. One end of the scraper, away from the load plate, is attached to an inner wall of the water storage tank.

Preferably, the scraper has a triangular longitudinal section. A point end of the scraper is attached to the inner wall of the water storage tank. The scraper is made of a rubber material.

Preferably, the pipe on the water storage tank is fixed on the side wall of the water storage tank, and is located under the load plate.

Compared with the prior art, the beneficial effect of the present invention is described below. A water storage tank is installed at one side of the switch-mode power supply unit to facilitate water collection, thereby improving the heat dissipation of the switch-mode power supply unit through water. An air conditioner is installed at the other side of the switch-mode power supply unit to facilitate the recovery and utilization of the heat emitted by the switch-mode power supply unit, thereby avoiding waste of heat. Pipes are provided between the air conditioner and the water storage tank to facilitate water recovery. A filter screen is installed in the water storage tank to filter the particles in the water. A filter cotton is provided under the filter screen to adsorb the water scale in the water, thereby facilitating water recycling and avoiding waste of resources. This switch-mode power supply waste heat recovery and utilization system can recover and use the heat in the water to avoid the waste of heat energy, and water can be recycled to save water resources.

BRIEF DESCRIPTION OF THE DRAWINGS

FIG. 7 is a bottom view of the connecting rod and the rectangular frame of the present invention;

FIG. 8 is a schematic view of a partial connection structure between the connecting rod and the load plate of the present invention.

DETAILED DESCRIPTION OF THE PREFERRED EMBODIMENTS

The technical solutions in the embodiments of the present invention will be described clearly and completely in conjunction with the accompanying drawings of the embodiments of the present invention. Obviously, the described embodiments are only a part of the embodiments of the present invention, rather than all the embodiments. Based on the embodiments of the present invention, all other embodiments obtained by those of ordinary skill in the art without creative work shall fall within the protection scope of the present invention.

Figure 1:
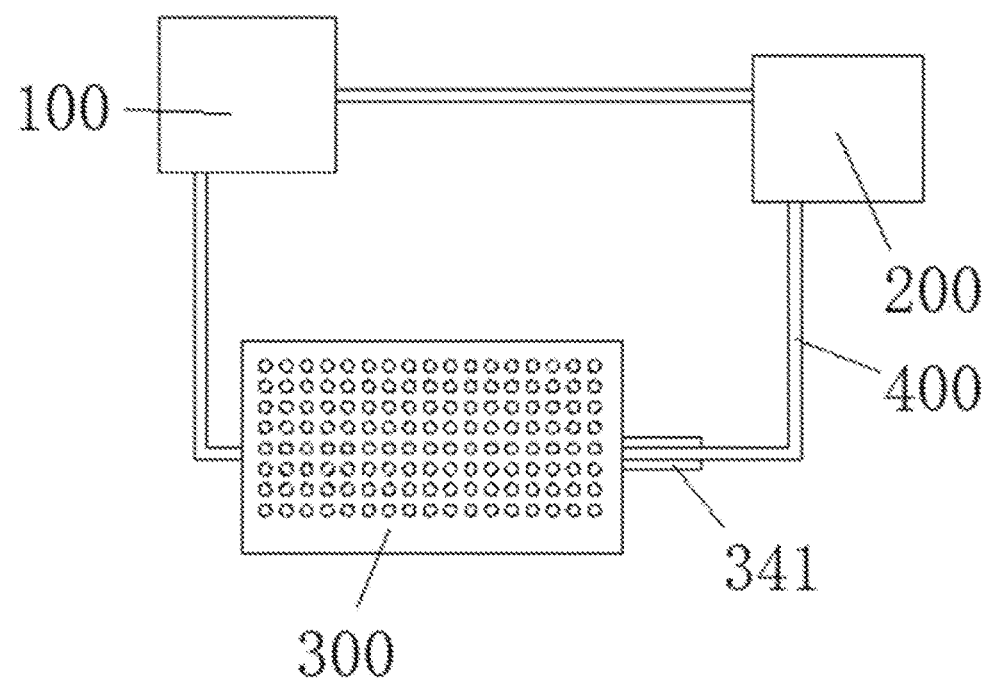
FIG. 1 is a top view of the present invention.
Figure 2:
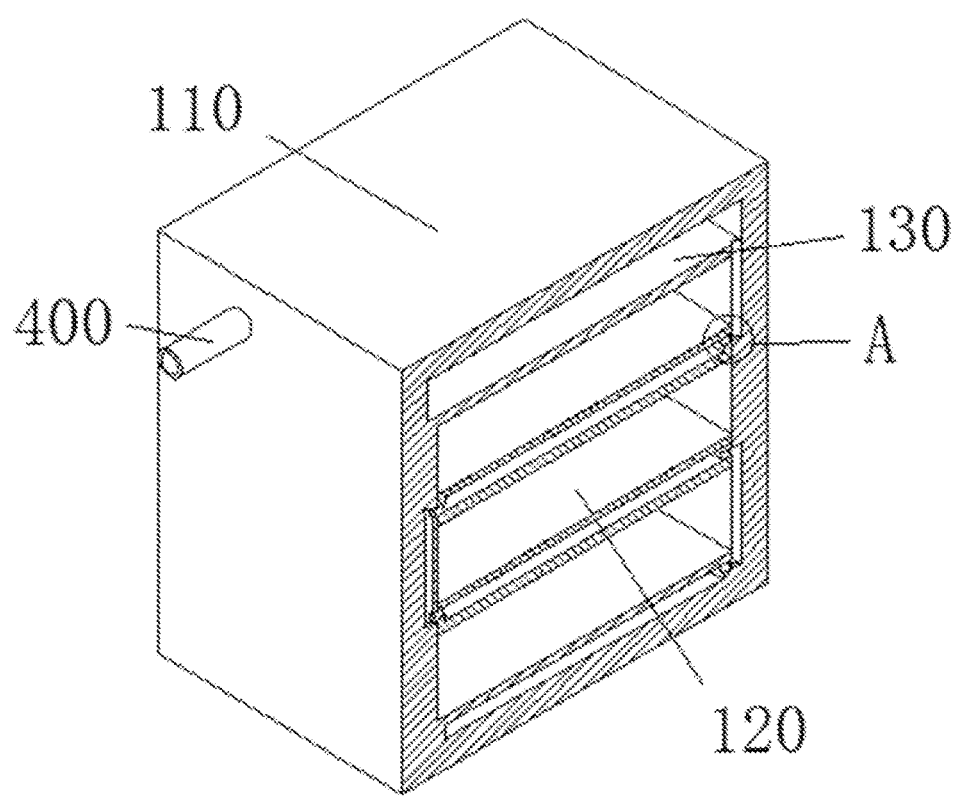
FIG. 2 is a cross-sectional view of the cabinet of the present invention.
Figure 3:
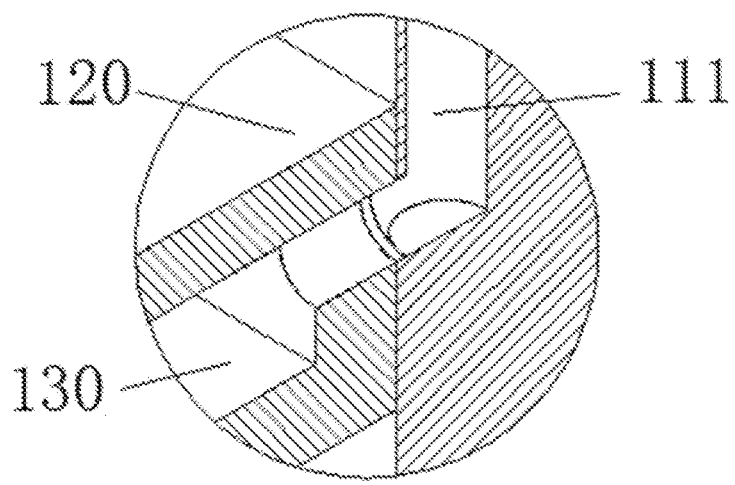
FIG. 3 is an enlarged view of circle A of FIG. 2.
Figure 4:
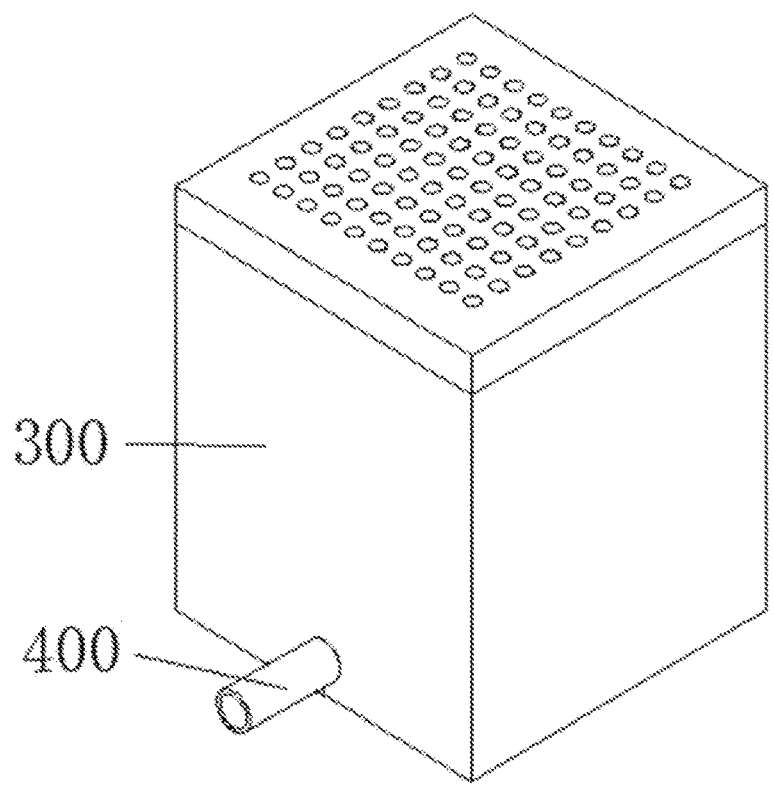
FIG. 4 is a perspective view of the water storage tank of the present invention.
Figure 5:
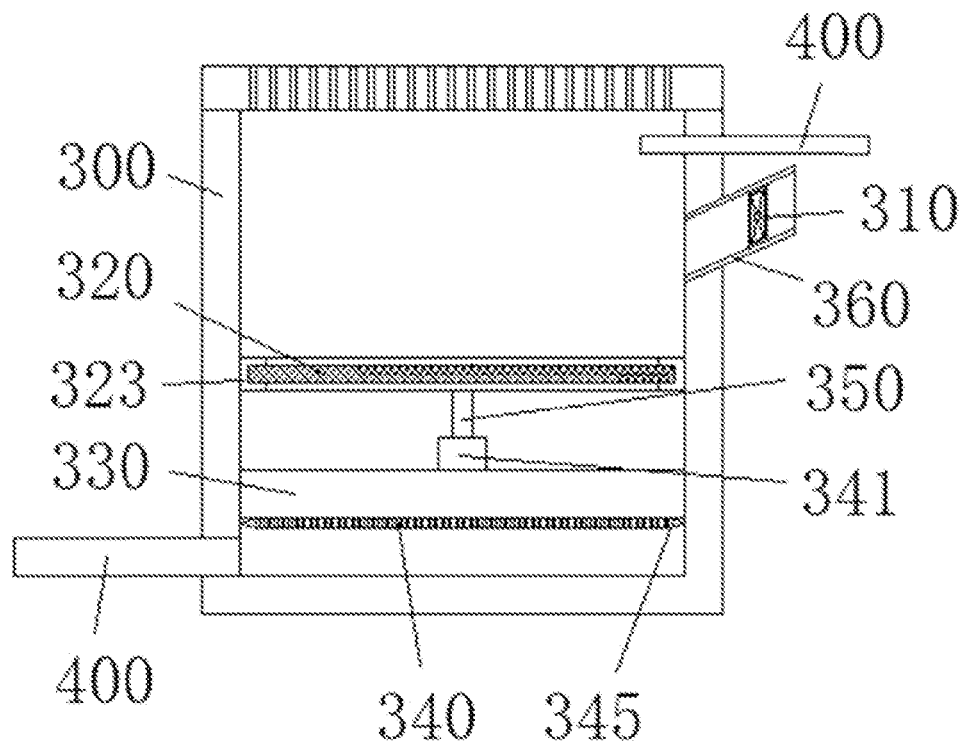
FIG. 5 is a schematic view of the internal structure of the front of the water storage tank of the present invention.
Figure 6:
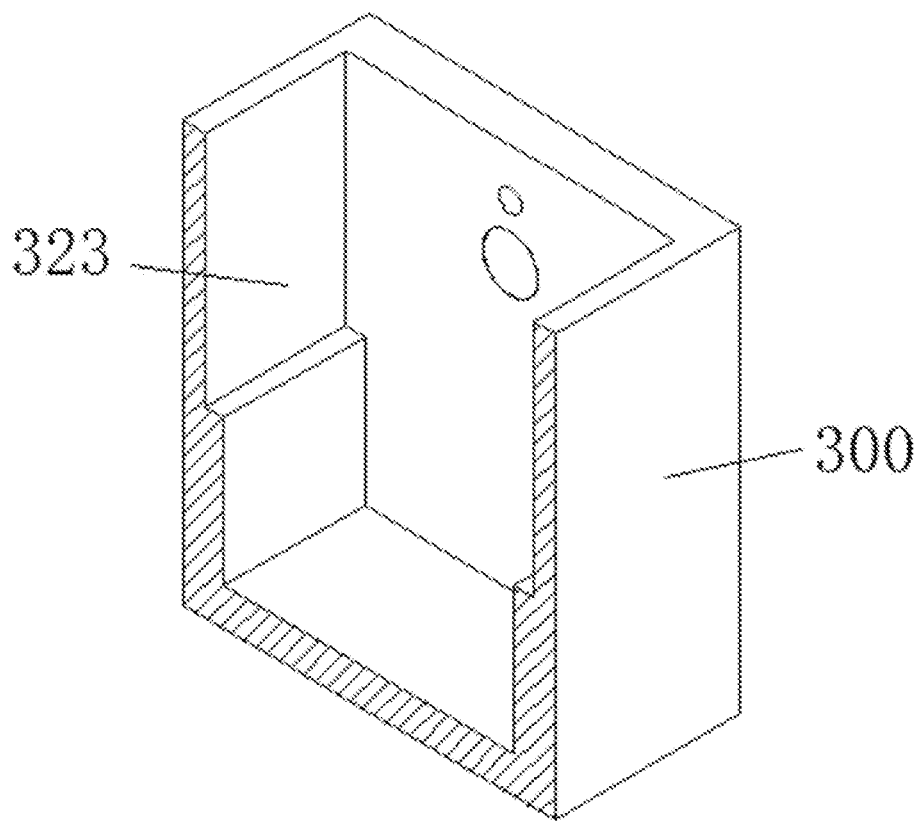
FIG. 6 is a cross-sectional view of the water storage tank of the present invention.
Figure 9:
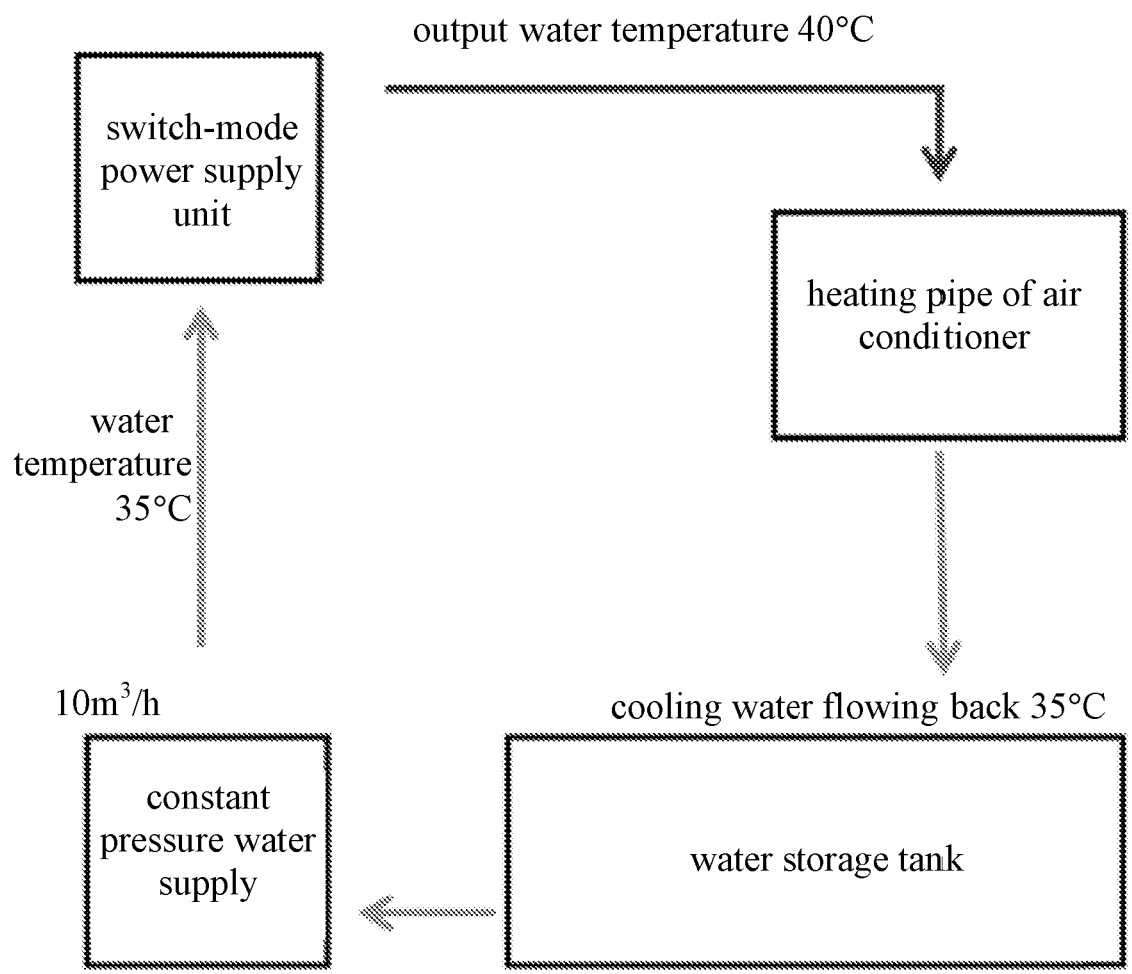
FIG. 9 is a diagram of the working principle of the present invention.

Referring to FIGS. 1 to 9, in an embodiment of the present invention, a switch-mode power supply waste heat recovery and utilization system comprises a switch-mode power supply unit 100, an air conditioner 200, and a water storage tank 300. The working principles and structures of the switch-mode power supply unit 100, the air conditioner 200 and the water storage tank 300 are all existing technologies, so they will not be described in detail hereinafter. The switch-mode power supply unit 100, the air conditioner 200 and the water storage tank 300 are all connected with pipes 400. The switch-mode power supply unit 100, the air conditioner 200 and the water storage tank 300 are in communication with each other through the pipes 400.

The switch-mode power supply unit 100 includes a cabinet 110. Fixed plates 120 are fixedly connected to the inner side wall of the cabinet 110 and are arranged at equal intervals. The top and bottom of the cabinet 110 and the interiors of the fixed plates 120 are formed with cavities 130. The pipes 400 are in communication with the cavities 130. The fixed plates 120 and the cabinet 110 are made of a thermally conductive material. The switch-mode power supply is installed to the fixed plates 120 through the prior art, such as screws. The heat from the switch-mode power supply can be transferred to the water in the cavities 130 through the cabinet 110 or the fixed plates 120, so that the heat from the switch-mode power supply can be easily taken away through the water.

A fan 310 is fixedly connected to the side wall of the water storage tank 300. The fan 310 is matched with the water storage tank 300. A filter screen 320 is insertedly connected to the inner side wall of the water storage tank 300. A filter cotton 330 is horizontally arranged under the filter screen 320. The lower surface of the filter cotton 330 is in contact with a load plate 340. The load plate 340 is connected to the filter screen 320 through connecting rods 350. The air outside the water storage tank 300 is sent to the water storage tank 300 through the fan 310, so as to facilitate the removal of residual heat in the water flowing out of the pipe 400 on the upper side of the fan 310, thereby facilitating the recycling of water. This not only avoids the waste of water resources but also improves the cooling efficiency of water cooling.

Staggered through holes 111 are formed in the opposing side walls of the cabinet 110. Every adjacent two of the cavities 130 are in communication with each other through a corresponding one of the through holes 111. The pipe 400 on the water storage tank 300 is fixedly connected to the side wall of the cabinet 110 and is in communication with the cavity 130 of the top of the cabinet 110. The plurality of through holes 111 communicate with the plurality of cavities 130 and are distributed in a curved shape, which facilitates the flow of water into the plurality of cavities 130. It is convenient for water to flow into the plurality of cavities 130, so as to take away the heat from the fixed plates 120.

The pipe 400 on the switch-mode power supply unit 100 is fixedly connected to the side wall of the cabinet 110, and is in communication with the cavity 130 of the bottom of the cabinet 110. The pipe 400 on the cabinet 110 is in communication with a heating pipe on the air conditioner 200, so that the water with heat can be delivered to the air conditioner 200. The heat can be dissipated through the air conditioner 200, thereby avoiding the waste of heat energy.

A retaining cylinder 360 is obliquely, fixedly connected to the side wall of the water storage tank 300. The fan 310 is fixedly connected to the inner side wall of the retaining cylinder 360. The pipe 400 on the air conditioner 200 is fixedly connected to the side wall of the water storage tank 300 and is located above the retaining cylinder 360, so that the water after heat dissipation can flow back into the water storage tank 300.

A rectangular frame 321 is provided on the outside of the filter screen 320. Grooves 322 communicating with each other are formed in the inner side walls of the rectangular frame 321. The four circumferential walls of the filter screen 320 are located in the grooves 322, which facilitates the installation and disassembly of the filter screen 320. The filter screen 320 is configured to filter the particles in the water.

Rectangular grooves 323 are formed in the opposing inner side walls of the water storage tank 300. The ends of the rectangular frame 321 are located in the rectangular grooves 323. The top of the rectangular groove 323 is open, which is convenient for taking out the rectangular frame 321.

The connecting rods 350 are symmetrically arranged below the rectangular frame 321. The upper ends of the connecting rods 350 are rotatably connected to the lower surface of the rectangular frame 321. Connecting cylinders 341 symmetrically arranged are fixedly connected to the upper surface of the load plate 340. The upper ends of the connecting cylinders 341 penetrate the filter cotton 330 and are threadedly connected to the respective connecting rods 350 so that the load plate 340 is connected to the filter screen 320.

A sealing gasket 342 is fixedly connected to the bottom of each connecting cylinder 341. The upper end of each connecting cylinder 341 is provided with an internal thread 343. The lower end of each connecting rod 350 is provided with an external thread 351. The external thread 351 is mated with the internal thread 343. The lower end face of each connecting rod 350 is in contact with the upper surface of the sealing gasket 342, so that the connecting rod 350 is threadedly connected to the connecting cylinder 341, thereby facilitating the disassembly and installation of the load plate 340.

The load plate 340 is formed with a plurality of perforations 344 that are equally spaced. A scraper 345 is fixedly connected to the circumferential wall of the load plate 340. One end of the scraper 345, away from the load plate 340, is attached to the inner wall of the water storage tank 300. It is convenient to clean the accretion on the inner wall of the water storage tank 300, thereby avoiding manual cleaning.

The longitudinal section of the scraper 345 is triangular. The point end of the scraper 345 is attached to the inner wall of the water storage tank 300. The scraper 345 is made of a rubber material, so as to avoid the damage to the inner wall of the water storage tank 300 caused by the excessively hard material of the scraper 345.

The pipe 400 on the water storage tank 300 is fixed on the side wall of the water storage tank 300, and the pipe 400 is located under the load plate 340. The water in the water storage tank 300 is delivered into the cabinet 110 through a water pump.

When in use, the water pump connected to the water storage tank 300 is started, so that the water pump delivers the water in the water storage tank 300 to the cavity 130 of the top of the cabinet 110 through the pipe 400. The water in the cavity 130 of the top of the cabinet 110 flows into the cavity 130 in the fixed plate 120 near the top of the cabinet 110 through the corresponding through hole 111 in the side wall of the cabinet 110, and then flows into the lower cavity 130 through the corresponding through hole 111 in the other side of the cabinet 110. Thereby, the water flows through the cavities 130 one by one and takes away the heat transferred by the fixed plates 120. The pipe 400 at the bottom of the cabinet 110 delivers the water with heat to the heating pipe of the air conditioner 200, so that the heat in the water can be dissipated through the air conditioner. This not only increases the indoor temperature but also avoids the waste of heat. The water flows back into the water storage tank 300 through the pipe 400 of the air conditioner 200. At the same time, the fan 310 is started, so that the fan 310 sends the air outside the water storage tank 300 into the water storage tank 300, thereby dissipating the preheating heat in the water flowing out of the pipe 400 above the fan 310. When the water flows through the filter screen 320, the filter screen 320 can filter the particles in the water. The suspended matter in the water, such as scale, can be adsorbed onto the filter cotton 330. Thereby, the scale in the water is reduced, and the cleanliness of the inside of the pipe 400 is ensured to a certain extent.

The term "fixedly connected to" described in the present invention means that the two parts connected to each other are fixed together by welding, screws, glue, and the like. The term "rotationally connected to" means that two parts are connected together and can move relative to each other.

Although the description is described in accordance with embodiments, but not each embodiment only includes an independent technical solution. This way of narrating the description is just for clarity. Those skilled in the art should consider the description as a whole. The technical solutions in the embodiments can also be appropriately combined to form other embodiments that can be understood by those skilled in the art.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A switch-mode power supply waste heat recovery and utilization system, comprising a switch-mode power supply unit, an air conditioner and a water storage tank, the switch-mode power supply unit, the air conditioner and the water storage tank being connected with pipes, the switch-mode power supply unit, the air conditioner and the water storage tank being in communication with each other through the pipes;

the switch-mode power supply unit including a cabinet, fixed plates being fixedly connected to an inner side wall of the cabinet and being arranged at equal intervals, a top and a bottom of the cabinet and respective interiors of the fixed plates being formed with cavities, the pipes being in communication with the cavities;

a fan being fixedly connected to a side wall of the water storage tank, the fan being matched with the water storage tank, a filter screen being insertedly connected to an inner side wall of the water storage tank, a filter cotton being horizontally provided under the filter screen, a lower surface of the filter cotton being in contact with a load plate, the load plate being connected to the filter screen through connecting rods.

2. The switch-mode power supply waste heat recovery and utilization system as claimed in claim 1, wherein staggered through holes are formed in opposing side walls of the cabinet, every adjacent two of the cavities are in communication with each other through a corresponding one of the through holes, the pipe on the water storage tank is fixedly connected to the corresponding side wall of the cabinet and is in communication with the cavity of the top of the cabinet.

3. The switch-mode power supply waste heat recovery and utilization system as claimed in claim 2, wherein the pipe on the switch-mode power supply unit is fixedly connected to the corresponding side wall of the cabinet and is in communication with the cavity of the bottom of the cabinet, and the pipe on the cabinet is in communication with a heating pipe on the air conditioner.

4. The switch-mode power supply waste heat recovery and utilization system as claimed in claim 1, wherein a retaining cylinder is obliquely, fixedly connected to the side wall of the water storage tank, the fan is fixedly connected to an inner side wall of the retaining cylinder, and the pipe on the air conditioner is fixedly connected to the side wall of the water storage tank and is located above the retaining cylinder.

5. The switch-mode power supply waste heat recovery and utilization system as claimed in claim 1, wherein a rectangular frame is provided on an outside of the filter screen, grooves communicating with each other are formed in inner side walls of the rectangular frame, and four circumferential walls of the filter screen are located in the grooves, respectively;

rectangular grooves are formed in opposing inner side walls of the water storage tank, ends of the rectangular frame are located in the rectangular grooves, and the rectangular grooves each have an open top.

6. The switch-mode power supply waste heat recovery and utilization system as claimed in claim 5, wherein the connecting rods are symmetrically arranged below the rectangular frame, upper ends of the connecting rods are rotatably connected to a lower surface of the rectangular frame, connecting cylinders symmetrically arranged are fixedly connected to an upper surface of the load plate, and upper ends of the connecting cylinders penetrate the filter cotton and are threadedly connected to the respective connecting rods.

7. The switch-mode power supply waste heat recovery and utilization system as claimed in claim 6, wherein a sealing gasket is fixedly connected to a bottom of each connecting cylinder, the upper end of each connecting cylinder is provided with an internal thread, a lower end of each connecting rod is provided with an external thread, the external thread is mated with the internal thread, and a lower end face of each connecting rod is in contact with an upper surface of the sealing gasket.

8. The switch-mode power supply waste heat recovery and utilization system as claimed in claim 1, wherein the load plate is formed with a plurality of perforations that are equally spaced, a scraper is fixedly connected to a circumferential wall of the load plate, and one end of the scraper, away from the load plate, is attached to an inner wall of the water storage tank.

9. The switch-mode power supply waste heat recovery and utilization system as claimed in claim 8, wherein the scraper has a triangular longitudinal section, a point end of the scraper is attached to the inner wall of the water storage tank, and the scraper is made of a rubber material.

10. The switch-mode power supply waste heat recovery and utilization system as claimed in claim 1, wherein the pipe on the water storage tank is fixed on the side wall of the water storage tank, and is located under the load plate.

\* \* \* \* \*